United States Patent [19]
Kobayashi et al.

[11] Patent Number: 5,775,889
[45] Date of Patent: Jul. 7, 1998

[54] HEAT TREATMENT PROCESS FOR PREVENTING SLIPS IN SEMICONDUCTOR WAFERS

[75] Inventors: Junichi Kobayashi, Sagamihara; Eiichiro Takanabe, Kangawa-ken; Harunori Ushikawa, Sagamihara; Tomohisa Shimazu, Minato-ku, all of Japan

[73] Assignee: Tokyo Electron Limited, Tokyo-to, Japan

[21] Appl. No.: 549,163

[22] Filed: Oct. 27, 1995

Related U.S. Application Data

[63] Continuation-in-part of Ser. No. 441,048, May 15, 1995, Pat. No. 5,688,116.

[30]    Foreign Application Priority Data

May 17, 1994  [JP]  Japan .................................. 6-128127
Oct. 31, 1994  [JP]  Japan .................................. 6-290582

[51] Int. Cl.⁶ ........................................... F27B 9/12
[52] U.S. Cl. ................................ 432/18; 432/6; 432/12
[58] Field of Search ........................... 432/206, 4, 6, 432/12, 18

[56]                References Cited

U.S. PATENT DOCUMENTS 5,297,956    3/1994    Yamabe et al. ............................ 432/5

FOREIGN PATENT DOCUMENTS

5-6894    1/1993    Japan .

*Primary Examiner*—Noah P. Kamen
*Attorney, Agent, or Firm*—Beveridge, DeGrandi, Weilacher & Young, LLP

[57]                ABSTRACT

A heat treatment apparatus comprising a reaction vessel located in a vertical furnace, and a ladder boat for mounting a plurality of semiconductor wafers one above another in parallel with each other. A vertical mounting pitch of mounting the wafers on the ladder boat is set at, e.g., 40 mm. When a treatment temperature is 1000° C., intra-surface temperature differences of the wafers, objects to be treated, can be suppressed to 10° C. at the time of passing 900° C. even when 600° C. is raised to 100° C. at a 100° C./min rate, whereby no slip occurs in large-diameter semiconductor wafers of an above 250 mm diameter even with high temperature increases at high rates in heat treatments, as of oxidation, diffusion, etc.

3 Claims, 8 Drawing Sheets

HEAT TREATMENT PROCESS FOR PREVENTING SLIPS IN SEMICONDUCTOR WAFERS

This application is a continuation-in-part of application Ser. No. 08/441,048; filed on May 15, 1995 now U.S. Pat. No. 5,688,116.

BACKGROUND OF THE INVENTION

The present invention is directed to apparatus for conducting batch heat treatments on a plurality of objects.

Processing of, e.g., semiconductor wafers (hereinafter called "wafers") includes heat treatments at high temperatures. This processing forms oxide films on the wafers, diffusing dopants, and others. Horizontal heat treatment furnaces have conventionally been dominant for conducting heat treatments. But recently, vertical heat treatment furnaces are increasingly used because of their homogeneous wafer intra-surface treatment, easy loading and unloading of the wafers, little entrainment of outside air into the furnaces, etc.

A vertical heat treatment apparatus using such a vertical heat treatment furnace includes a ladder boat; A ladder boat is one kind of a vertical wafer boat which holds a number of wafers vertically spaced from each other. The wafers the can be loaded and unloaded and out of the heat treatment furnace. The ladder boat comprises a top plate and a bottom plate vertically opposing each other, four support rods of, e.g., quartz provided between the top and the bottom plates. Grooves are formed in the respective support rods into which the peripheral edges of wafers are inserted in a set direction (for example, in a horizontal direction).

When a set number (e.g., 50 sheets) of wafers W have been mounted on the ladder boat, an elevator is used to load the ladder boat into the heat treatment furnace, then a required batch heat treatment on the wafers can be performed. Especially recently, higher speed heat treatments and higher throughputs are required in accordance with higher integration (e.g., above 60 M) and larger sizes (12 inches) of wafers.

Figure 9:
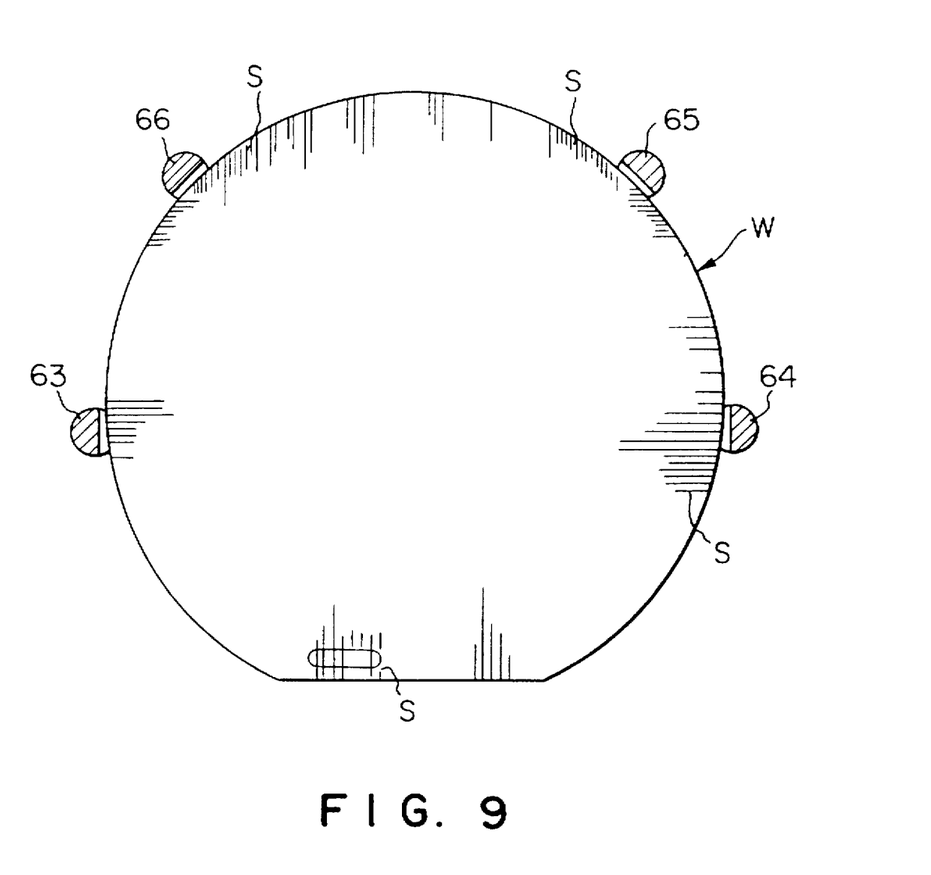
FIG. 9 is a plan view showing parts of a wafer where slips occur according to the conventional heat treatment process.

Because silicon which is a base material of the wafers has a melting point of 1410° C., crystal defects called slip (the parts indicated by S in FIG. 9) tend to take place in vicinities of parts of the wafers supported by the support rods 63, 64, 65, 66 of the ladder boat as shown in FIG. 9, when a heat treatment is conducted on the wafers at a temperature, e.g., 1000° C. approximate to the melting point. These slips are fine broken layers which are difficult to be visually recognized but can be seen by magnifying glasses or metal microscopes (the slips in FIG. 9 were partially visible but confirmed by a 50 magnification metal microscope).

Causes for the occurrence of the slips are: 1) internal stresses due to tare weights of the wafers; and 2) thermal strain stresses due to intra-surface temperature disuniformity of the wafers. That is, although a mechanism for the occurrence is not clear, it is considered in connection with cause 1) that because the wafers are supported by the ladder boat at the peripheral edges, supported partially at four positions, large internal stresses take place due to tare weights of the wafers being heat-treated in vicinities of the supported parts. When the internal stresses exceed a certain magnitude, the slips occur. Furthermore, even wafers having specification values have "sori", and get additional sori due to temperature distributions when heated. In addition, the grooves in the support rods have machining errors. If one of the supported parts of a wafer should come out of the associated groove, the wafer is supported at three parts, and loads born by the respective supported parts are unbalanced. Consequently it often takes place that large stresses exceeding a threshold for the occurrence of the slips are generated at, e.g., one of the supported parts.

In connection with the cause 2), heat is conducted to and from the wafers via the support rods of the heat treatment boat when the wafers are heated, and temperature differences take place between the central parts of the wafers and the peripheral edges thereof and cause thermal strain stresses. It is considered that the slips occur when the thermal strain stresses exceed a certain magnitude. On the other hand, recently the structure of the heat treatment furnace itself, and the heater have been improved, and heat treatment furnaces whose low internal temperatures can be raised at a rate as high as, e.g., 100° C./minute are fabricated. Such a high-speed furnace can decrease thermal budget and can improve throughputs. On the other hand, the furnace has a disadvantage that intra-furnace temperature differences are increased upon temperature increase and decrease, and larger thermal strain stresses take place in the wafers, and the slips take place especially when the wafers are heat-treated at high temperatures approximate to the melting point of the base material of the wafers. To solve this problem, various discussion have been made on the structure of the wafer boat. For example, a wafer boat typically a called "ring boat" is often used. In the ring boat, wafers are not supported by grooves formed in the support rods of the boat. Rings instead are supported in the grooves, and wafers are held directly on the rings. The peripheral edges of the wafers surface-contact with the rings, and internal stresses of the wafers are mitigated, whereby the occurrence of the slips can be. The ring boat, however, is difficult to fabricate and.

But the ring boat is difficult to fabricate and expensive. Furthermore, a robot carrier arm cannot enter between the support rods when wafers are transferred, as can in the ladder boat. Thus a mechanism for pushing up the wafers from below to load the wafers is necessary, which makes the structure of the wafer carrier system complicated. This is also a problem. In addition, it is much required to preclude the slips without changing the structure of the wafer boat.

SUMMARY OF THE INVENTION

The present invention was made in view of these problems. An object of the present invention is to provide a heat treatment process which can preclude occurrence of slips in a heat treatment.

The present invention relates to a heat treatment apparatus for holding a number of objects to be treated by a holding means at a vertical interval and loading the holding means into a heat treatment furnace. The objects-to-be-treated then being heat-treated while temperatures in the heat treatment furnace are controlled. The controlled temperature increasing pattern has a smaller temperature increasing rate gradient than a threshold temperature increasing rate pattern for preset heat treating temperatures, which is able to prevent occurrence of slips in the objects-to-be-treated.

It is considered that slips taking place when wafers are heat-treated occur when thermal strain stresses become large when the wafers are heated to some extent. According to the applicant's experiments, slips were observed in a range of temperatures above a heating temperature of 900° C. unless wafers were considerably gradually heated. Here the range of high temperatures includes different threshold temperature increasing rate patterns for a range of, e.g., 900°–980° C. and a range of temperatures above the former. Such threshold temperature increasing rate patterns depend on vertical arrangement pitches of the wafers.

In accordance with the present invention, a heat treatment is conducted with the arrangement pitch set at a required value and a substantial threshold temperature increasing rate pattern given for the high temperature ranges. Temperatures can be effectively raised and lowered, high throughputs can be obtained, and in addition occurrence of slips can be prevented. Threshold temperature increasing and decreasing rates for prevention of slips become lower as temperatures rise. In a high temperature range of above 900° C., for example, the temperature is raised in two steps of, e.g., 13° C. and 5° C., whereby a heat treatment can be conducted effectively without occurrence of slips.

DETAILED DESCRIPTION OF THE PREFERRED EMBODIMENTS

First Embodiment

Figure 1:
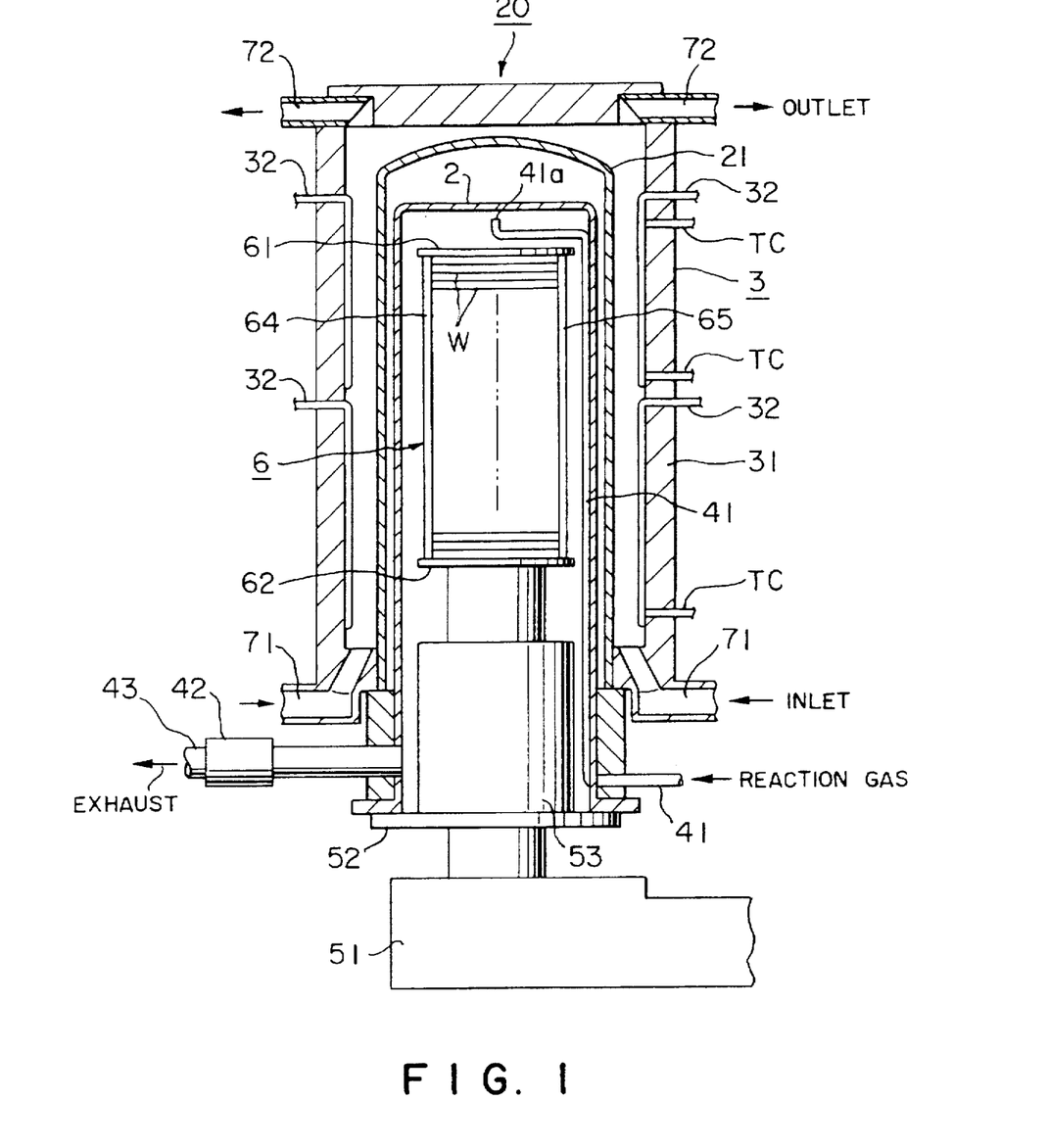
FIG. 1 is a vertical sectional view of one example of the vertical heat treatment apparatus used for the heat treatment process according to a first embodiment of the present invention.

FIG. 1 is a vertical sectional view of the vertical heat treatment apparatus for practicing the process according to a first embodiment of the present invention, which explains the general structure of the apparatus. A vertical heat treatment furnace 20 comprises a heating unit 3 enclosing a reaction tube 2. The reaction tube 2 comprises a tube of a heat resistant, corrosion resistant material (e.g., quartz) having, for example, the upper end closed and the lower end opened. A liner tube 21 of, e.g., quartz encloses the reaction tube 21. The heating unit 3 comprises a plurality of stages of heating blocks provided on the inside surface of a heat insulator 31 in such a manner as to enclose the liner tube 21. Each heating block is made of a resistance heating wire 32 vertically wound along the inside circumferential surface of the heat insulator 31. A material of the resistance heating wire 32 can be, e.g., molybdenum disilicate (MoSi$_2$) to enable hig-speed temperature rise and fall. The heating wires 32 can raise an internal temperature of the reaction tube 2 at a high temperature increasing rate of 50°–100° C. A thermocouple TC is provided on each heating wire 32 for measuring temperatures of the heating wire 32.

A processing gas feed pipe 41 which is connected to gas supply sources not shown is inserted in the reaction tube 2. The forward end 41a of the gas feed pipe 41 is extended up to a position where the forward end 41a is opposed to the ceiling of the reaction tube 2. An exhaust pipe 43 connected to a vacuum pump 42 is provided in the reaction tube 2.

Figure 2:
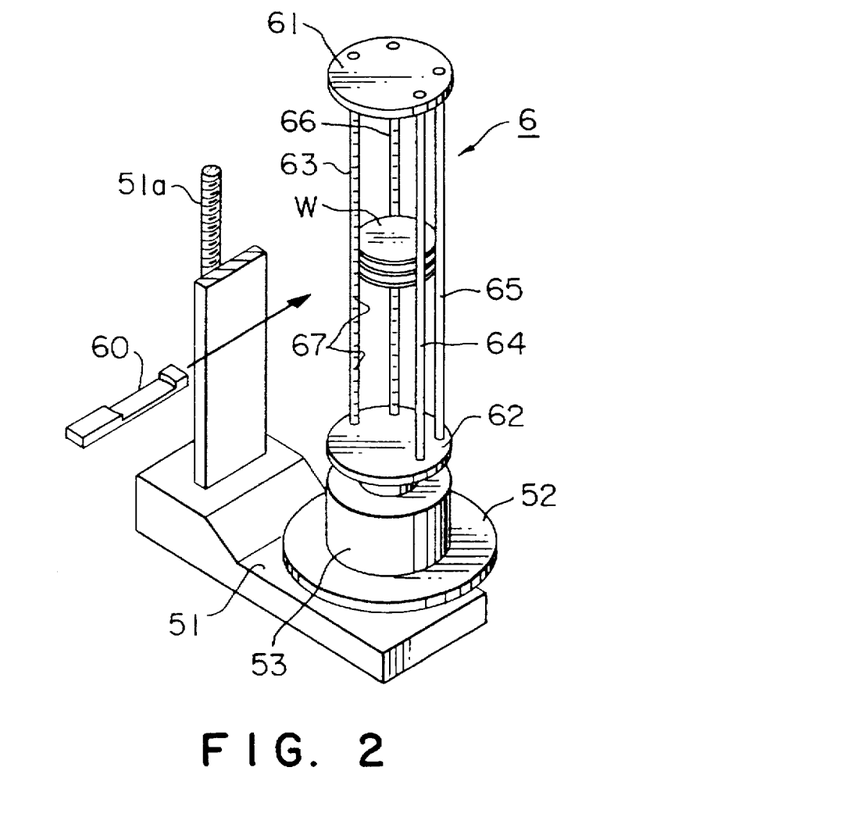
FIG. 2 is a perspective view of one example of a ladder boat used in the heat treatment process according to the first embodiment of the present invention.

Below the reaction tube 2 there is provided a boat elevator 51 which is moved up and down on a screw rod 51a (see FIG. 2). A cap 52 is mounted on the boat elevator 51. The cap 52 air-tightly closes the open bottom of the reaction tube 2 when the cap 52 is at its uppermost position. A ladder boat 6 which is a holder is provided on the cap 52 with a heat insulating cylinder 53 provided therebetween. As shown in FIG. 2, four support rods of, e.g., quartz are provided between an upper plate 61 and a bottom plate 62 vertically opposed to each other with a required interval therebetween. The four support rods 63–66 are so arranged that two 63, 64 of the four support rods 63–66 support the upper and the bottom plates 61, 62 at the left and the right of the forward side in the direction of advance of a wafer transfer fork 60 into the ladder boat 6, and the rest two support rods 65, 66 support the upper and the bottom plates at the left and the right of the backward side in the direction of advance of the wafer transfer fork 60 into the ladder boat 6.

Figure 3:
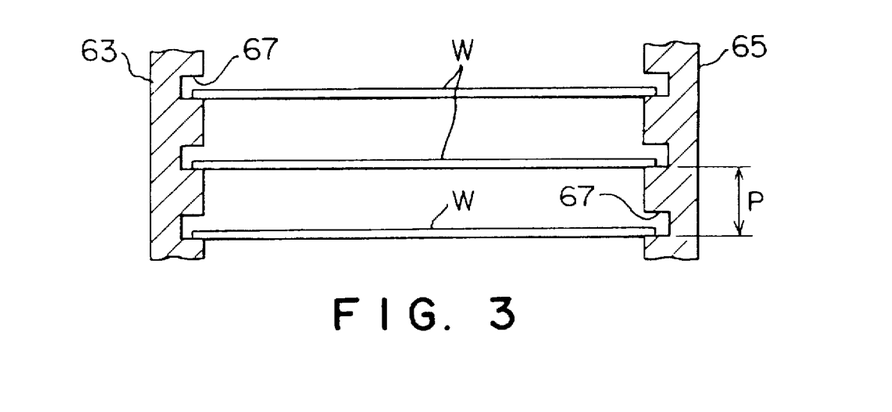
FIG. 3 is a vertical sectional view of grooves of the ladder boat of FIG. 2, and the state of wafers supported in the grooves.

As enlarged in FIG. 3, grooves 67 having a little larger vertical length than a thickness of wafers W so that the wafers W can be inserted in the grooves with the undersides of the peripheral edges supported therein are formed in the respective support rods 63–66. The wafers W are placed into the grooves 67 and taken out of the grooves 67 by the transfer fork 60 through the two forward support rods 63, 64. In the present embodiment, as shown in FIG. 3, the grooves 67 are provided at a pitch (d) of 3/16 inches. An arrangement pitch (p) of the wafers W inserted in the grooves 67 (a distance between the underside of each wafer W and that of a next below one W) is 3/16 inches.

Air inlets 71, and air outlets 72 are provided respectively in the upper end and in the bottom of the vertical heat treatment furnace 20 between the heating unit 3 and the reaction tube 2. The air inlets 71 and the air outlets 72 are provided in the reaction tube 2 circumferentially at four positions. Blower fans and exhaust fans not shown are provided respectively in the air inlets 71 and in the air outlets 72. Forced cooling means is thus constituted for forcedly cooling the interior of the reaction tube 2.

Next, the first embodiment of the heat treatment process conducted by the above-described vertical heat treatment apparatus will be explained. First, the interior of the reaction tube 20 is set at 400° C. Sixty sheets, for example, of wafers W held on the ladder boat 6 are loaded into the reaction tube 2 by the boat elevator 51 through the opened bottom thereof. A vertical pitch of the grooves 67 (FIG. 3) formed in the ladder boat 6 is, e.g., 3/16 inches. The wafers W held in the grooves 67 of this pitch have an arrangement pitch of 3/16 inches.

Figure 4:
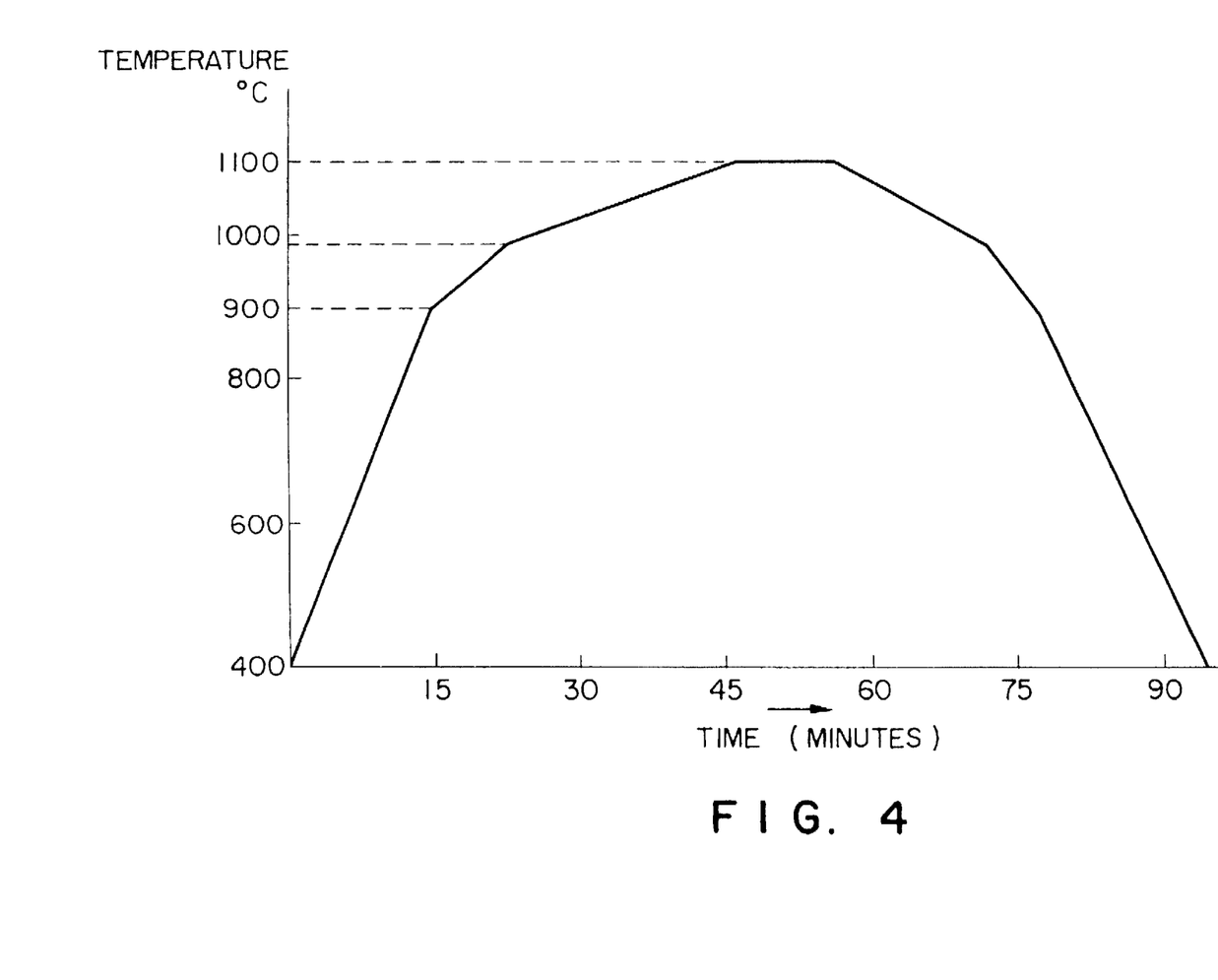
FIG. 4 is a characteristic curve of a pattern of temperature raising rates in the vertical heat treatment furnace according to the first embodiment of the present invention.

Then, electric power is supplied to the resistance heating wires 32 from the outside. The power supply is so controlled that, as shown in FIG. 4, the interior of the reaction tube 2 is heated at a high temperature increasing rate of above 100° C., e.g., 34° C./minute until the heat treatment region in the reaction tube 2 has a temperature of about 900° C. Here, the heat treatment region in the reaction tube 2 being about 900° C. means that because the region where those of objects-to-be-treated, wafers W held on the ladder boat except the top and the bottom dummy wafers are arranged does not have a perfectly uniform temperature distribution, the heat treatment region has a temperature range of, e.g., 900° C. plus or minus a temperature difference of the temperature distribution. Hereinafter this is the same with a temperature of the interior of the reaction tube 2. The 34° C. temperature increasing rate is not a set value for the control unit but a temperature increasing rate actually measured in the heat treatment region in the reaction tube 2 by TCs.

When a temperature of the heat treatment region in the reaction tube 2 has reached 900° C., as shown in FIG. 4, the temperature increasing rate is decreased in steps or continuously between 900° C. and 980° C. For example, the temperature in the reaction tube 2 is raised at, e.g., above 9° C./minute, a low temperature increasing rate of, e.g., about 10° C./minute, and between 980° C. and 1100° C. the temperature in the reaction tube 2 is raised at about a 5° C./minute temperature increasing rate. When the temperature in the reaction tube has reached, e.g., about 1,100° C., required oxidation gases, e.g., $O_2$ gas and HCl gas are fed into the reaction tube 2 through the gas feed pipe 41 while the interior of the reaction tube 2 is exhausted through the air outlets 43 to maintain a required pressure, e.g., the normal pressure in the reaction tube 2. In this state the wafers are oxidized.

Following a preset time of the oxidation, a preparatory step for a next process is conducted. For example, the interior of the reaction tube 2 is purged with an inert gas (e.g., $N_2$ gas) while as shown in FIG. 4, the temperature of the interior of the reaction tube is lowered down to 980° C. at a set temperature decreasing rate (e.g., 8° C./minute) and subsequently down to 900° C. at an about 15° C./minute temperature decreasing rate. Then, air is forcedly blown between the reaction tube 2 and the heating unit 3 through the air inlets 71 while exhausted through the air outlets 72, whereby the interior of the reaction tube 2 is forcedly cooled down to, e.g., 400° C. at an about 30° C./minute temperature decreasing rate, and then the cap 52 is opened to unload the ladder boat out of the reaction tube 2.

As evident from the following experimental results, by the heat treatment process according to the present invention, no slips occur in the wafers W, and high throughputs can be obtained. That is, presence of slips was checked in 6-inch wafers W held on the ladder boat at a vertical wafer arrangement pitch of ³⁄₁₆ inches and at various temperature increasing rates. In the temperature increasing rate pattern, the temperature (400° C.) at which the wafers W were loaded was raised to 900° C. at a high rate (e.g., 30° C./minute) and raised at the low rate in the temperature range of above 900° C. TABLE 1 shows the temperature ranges, temperature increasing rates and presence of slips. Temperature increasing rates are averages of temperatures of a wafer in the tenth grooves (indicated by "10" on the left in TABLE 1) of the ladder boat from the bottom and of a wafer in the thirteenth grooves (indicated by "31" on the left in TABLE 1) from the bottom by thermocouples at totally 4 positions, i.e., the quarters of the circumference which is 10 mm inner of the circumferential edge, and the center.

TABLE 1

(Wafer arrangement pitch: ³⁄₁₆ inches)

| Groove Ordinal Number | Temperature Range °C. | | | | | | Presence of Slip |
|---|---|---|---|---|---|---|---|
| | 400–900 | 900–980 | 980–1100 | 1100–980 | 980–900 | 900–400 | |
| | °C./Min | | | | | | |
| TEST 10 | 34 | 11 | 11 | 7 | 14 | 30 | present |
| RUN 1 31 | 31 | 13 | 13 | 7 | 24 | 29 | |
| TEST 10 | 34 | 11 | 7 | 7 | 14 | 30 | present |
| RUN 2 31 | 31 | 13 | 7 | 7 | 14 | 29 | |
| TEST 10 | 34 | 11 | 6 | 7 | 14 | 30 | absent |
| RUN 3 31 | 31 | 13 | 6 | 7 | 14 | 29 | |
| TEST 10 | 43 | 12 | 5 | 7 | 14 | 30 | absent |
| RUN 4 31 | 43 | 14 | 5 | 7 | 14 | 29 | |
| TEST 10 | 43 | 17 | 5 | 7 | 14 | 30 | present |
| RUN 5 31 | 43 | 19 | 5 | 7 | 14 | 29 | |
| TEST 10 | 43 | 12 | 5 | 10 | 16 | 30 | present |
| RUN 6 31 | 43 | 14 | 5 | 16 | 16 | 29 | |

By checking presence of slips in various temperature increasing rate patterns (for example, visually confirming presence of slips and reconfirm by a 100-magnification metal microscope or etching), suitable temperature increasing rates can be found. That is, as shown in TABLE 1, in Test Run 1, in which a temperature increasing rate was 13° C./minute from 900° to 1100° C. (the higher one of the temperature increasing rates of the tenth and the thirteenth wafers from the bottom of the ladder boat 6 was taken), slips occurred. But no slip took place as in Test Run 3, in which a temperature increasing rate was as low as 6° C./minute in the range of temperatures above 980° C. In Test Runs 3 and 4, a temperature increasing rate was as high as 14° C./minute from 900° to 980° C., no slip took place. Thus it is found that no slip occurs with a temperature increasing rate of below 14° C./minute or below 6° C./minute from 900° to 980° C. and from 980° to 1100° C. Accordingly, a temperature increasing rate is lowered in steps (two steps in the above-described embodiment) in the ranges of temperatures above 900° C. A threshold temperature increasing rate pattern which causes no slip is determined in advance, and based on the determined temperature raising rate pattern, temperature increasing rates are set, whereby slips in the wafers can be precluded, and high throughputs can be obtained.

As in Test Run 4, no slip took place even at a high temperature increasing rate of, e.g., 43° C./minute in the range of temperatures below 900° C. This agrees with the inventors'finding in their preparatory experiments that temperature increasing rates become very influential at temperatures above about 900° C. Therefore, it is necessary that the interior of the reaction tube 2 is heated at a high temperature increasing rate up to 900° C. after the ladder boat has been loaded into the reaction tube 2, and the temperature is raised in steps at low temperature increasing rates in the ranges of temperatures above 900° C. so as to ensure high throughputs without slips.

The temperature decreasing process is considered to be the same as the temperature increasing process. It is difficult to control the temperature decreasing process. It is preferred that blowing rates of the forced cooling means are adjusted to give a threshold temperature decreasing rate pattern.

The reason the temperature increasing rate has to be lowered in the ranges of temperatures above 900° C., as described above, is that the base material, silicon, whose melting point is 1,410° C., becomes sensitive to internal stresses when a heating temperature is above about 900° C., The sensitivity increases with increases of the heating temperature. It is considered that unless the temperature increasing rate is low, slips occur.

Six-inch wafers, as wafers W, as used in the above-described experiment, were arranged on the ladder boat at a ⅛ inch arrangement pitch. The presence of slips was then checked for the respective temperature increasing rates of various temperature increasing rate patterns by the use of the same apparatus (FIG. 1) as in the above-described experiment. The result is shown in TABLE 2.

TABLE 2

(Wafer arrangement pitch: ⅛ inches)

| Groove | | Temperature Range °C. | | | | | Presence of Slip |
|---|---|---|---|---|---|---|---|
| Ordinal Number | 400– 900 | 900– 980 | 980– 1100 | 1100– 980 | 980– 900 | 900– 400 | |
| | | | °C./Min | | | | |
| TEST | 10 | 62 | 17 | 12 | 13 | 14 | 34 | present |
| RUN 1 | 31 | 54 | 18 | 12 | 13 | 14 | 34 | |
| TEST | 10 | 62 | 17 | 9 | 13 | 14 | 34 | present |
| RUN 2 | 31 | 54 | 18 | 9 | 13 | 14 | 34 | |
| TEST | 10 | 62 | 17 | 8 | 13 | 14 | 34 | absent |
| RUN 3 | 31 | 54 | 18 | 8 | 13 | 14 | 34 | |
| TEST | 10 | 62 | 18 | 7 | 13 | 14 | 34 | absent |
| RUN 4 | 31 | 54 | 19 | 7 | 13 | 14 | 34 | |
| TEST | 10 | 62 | 23 | 7 | 13 | 14 | 34 | present |
| RUN 5 | 31 | 54 | 23 | 7 | 13 | 14 | 34 | |
| TEST | 10 | 62 | 23 | 7 | 7 | 22 | 34 | present |
| RUN 6 | 31 | 54 | 23 | 7 | 7 | 22 | 34 | |

As evident from the results of RUN 2 and RUN 3 in TABLE 2, no slip occurs in the wafers in the temperature range of 980°–1,100° C. at a temperature increasing rate of below 8° C./minute. As evident from the result of RUN 3 and RUN 4 in TABLE 2, no slip takes place in the temperature range of 900°–980° C. at a temperature increasing rate of 18° C./minute. Here the case of 3/16 inch arrangement pitch of wafers on the ladder boat, and that of ⅛ inch arrangement pitch will be compared with each other. Setting the wafers at the ⅛ inch arrangement pitch resulted in the higher threshold temperature increasing rate for the absence of slips. Accordingly it is found that wider wafer arrangement pitch is effective for ensuring prevention of occurrence of slips. A reason for this is considered to be that a larger spacing between each of the wafers and its adjacent one permits radiation from the surrounding heating unit 3 to directly reach the central part of the wafers with a result that intra-surface temperature uniformity of the wafers transiently becomes higher. Based on the above-described experimental results, in cases of wafer arrangement pitches above the 3/16 inch arrangement pitch, and cases of wafer arrangement pitches above the ⅛ inches, occurrence of slips can be prevented by raising the temperatures at lower temperature increasing rates lower than the above-described respective threshold temperature increasing rate.

Because threshold temperature increasing rates thus change depending on wafer arrangement pitches, threshold temperature increasing rates are found by changing a temperature increasing rate pattern for a wafer arrangement pitch, and a temperature increasing pattern is set, based on the threshold temperature increasing rate pattern. Thus a temperature increasing rate pattern is set for operation of the heat treatment apparatus. As a result, without using the ring boat, which is difficult for wafers to be transferred to and from, and which is expensive, the ladder boat as shown in FIG. 2, which is easy for wafers to be transferred to and from, and which is inexpensive, is used, and occurrence of slips can be prevented while a treatment is conducted at high throughputs. An industrial advantageous heat treatment process can be provided. The threshold temperature increasing rate is low especially above 900° C. and becomes lower for higher heating temperature ranges. Accordingly it is preferred to prevent occurrence of slips and obtain high throughputs that the temperature is raised at a high temperature increasing rate up to 900° C., and thereafter the rate is lowered in steps. In future the heat treatment apparatus is expected to be more improved and allow higher temperature increasing rates. The heat treatment process according to the present invention is effective to use such improved heat treatment apparatus. The present invention is applied to the ladder boat but is applicable to the ring boat.

As described above, according to the present invention, slips can be prevented in loading a number of wafers into a heat treatment furnace and heat-treating the same.

Second Embodiment

Next, the heat treatment apparatus according to a second embodiment of the present invention will be explained.

According to a finding of the inventors of the present invention, occurrence of slips in wafers much depend on yield values of the shearing stress of silicon which is a material of the wafers. It is also generally known that the yield shearing stress much depends on silicon temperatures.

Figure 5:
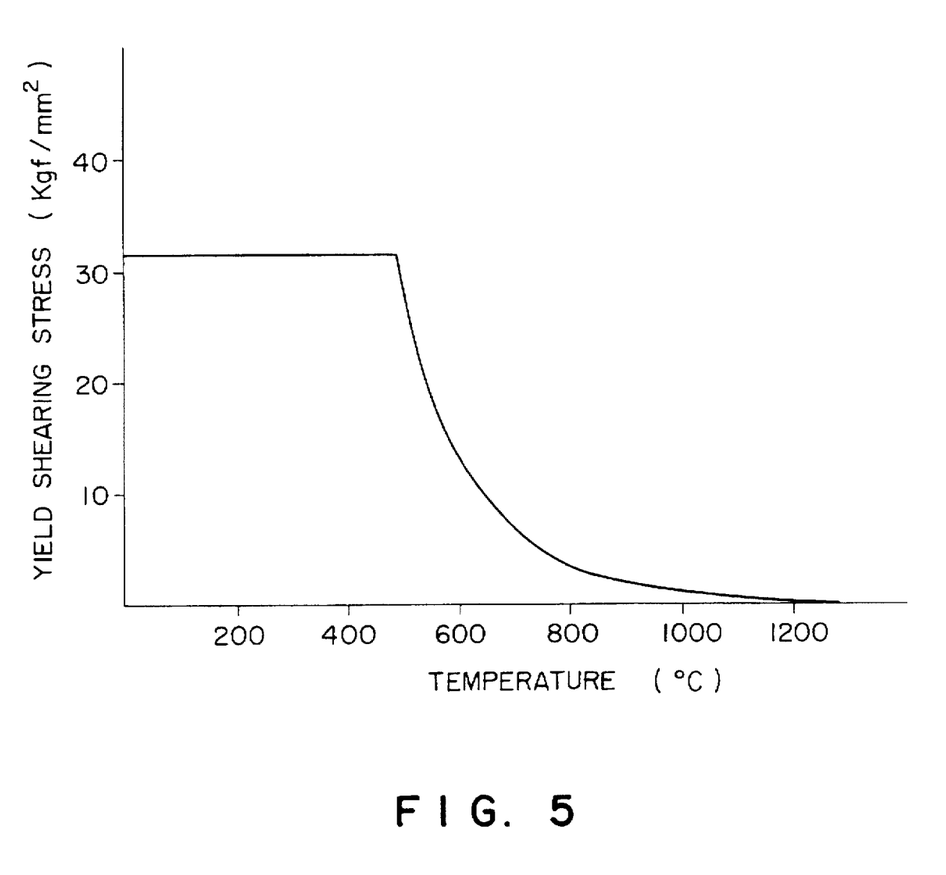
FIG. 5 is a graph of relationships between wafer temperature and silicon yield shearing stresses.

FIG. 5 is a graph of relationships between wafer temperatures and silicon yield shearing stresses based on "Macroscopic plastic properties of dislocation-free germanium and other semiconductor crystals. 1. Yield behavior" which is a study of silicon yield stress referred to in IEEE "TRANSACTION ON SEMICONDUCTOR MANUFACTURING". Vol. 1, No. 3 (August 1988).

In FIG. 5, the yield shearing stress (kgf/mm$^2$) abruptly lowers at around 500° C., somewhat slowly lowers at 600°–800° C. and thereafter smoothly lowers. Based on this silicon characteristic, it is found that because the yield stress value decreases are larger at higher treatment temperatures, allowable intra-surface temperature differences which cause no slips in wafers are accordingly smaller.

In the system in which wafers are heated by radiation heat from a tubular furnace, it is considered that the intra-surface temperature differences can be smaller at larger pitches of wafers arranged one above another. As described above, the intra-surface temperature difference is larger at higher temperature increasing rates. In connection with productivity, the batch processing has no merit unless wafers can be processed more efficiently than the sheet processing.

According to the heat treatment apparatus of the second embodiment of the present invention wherein the inventors have made in the above-described background, wafer mounting pitches which can restrict intra-surface temperature differences to allowed temperature differences which cause no slip are given in accordance with treatment temperatures. The mounting pitch in the present invention is a distance between the middle of a thickness of a wafer and that of a thickness of a lower next wafer, i.e., a distance between the upper end surface of one of wafers mounted parallel with each other one above another on a ladder boat.

Figure 6:
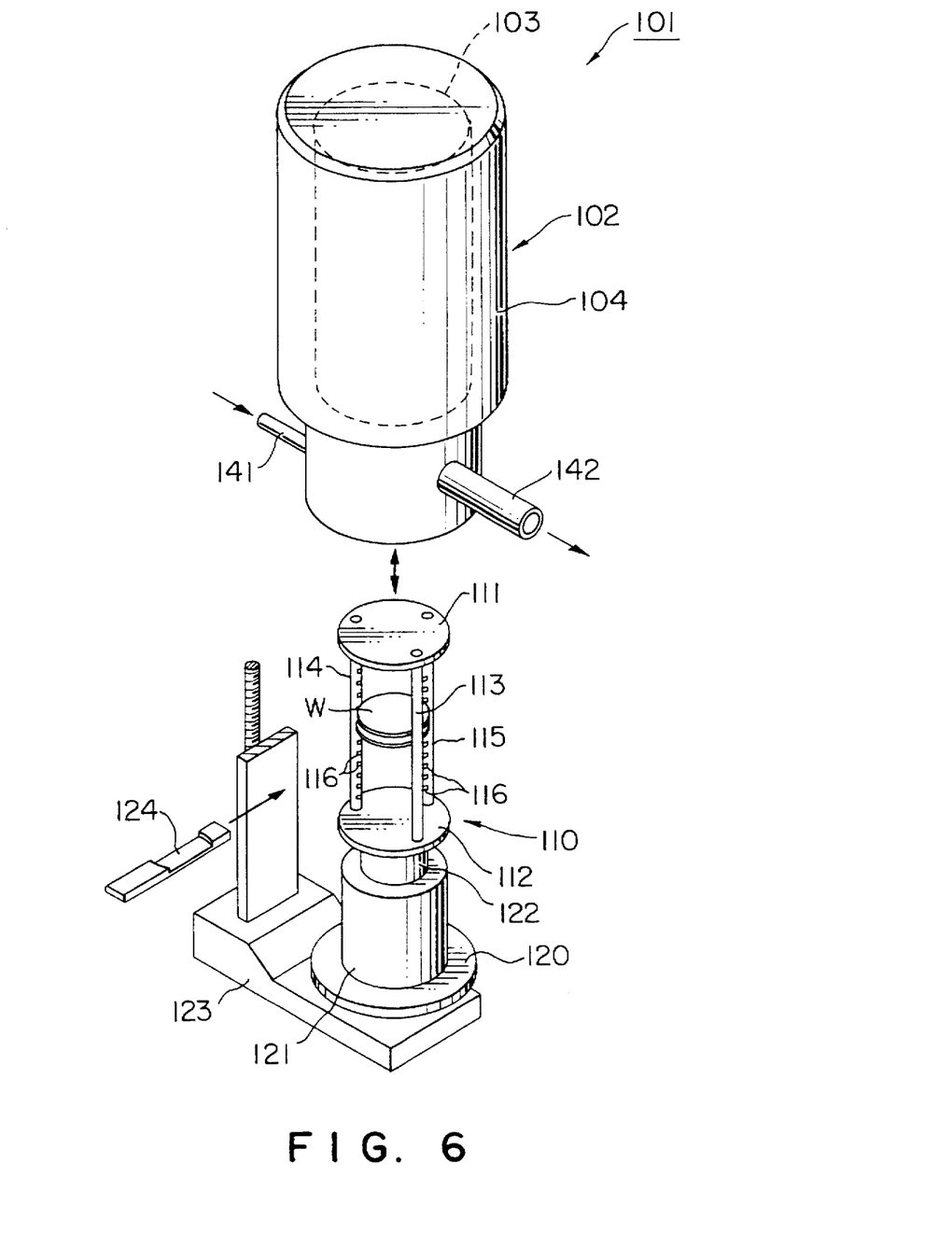
FIG. 6 is a diagrammatic view of the heat treatment apparatus according to a second embodiment of the present invention.
Figure 7:
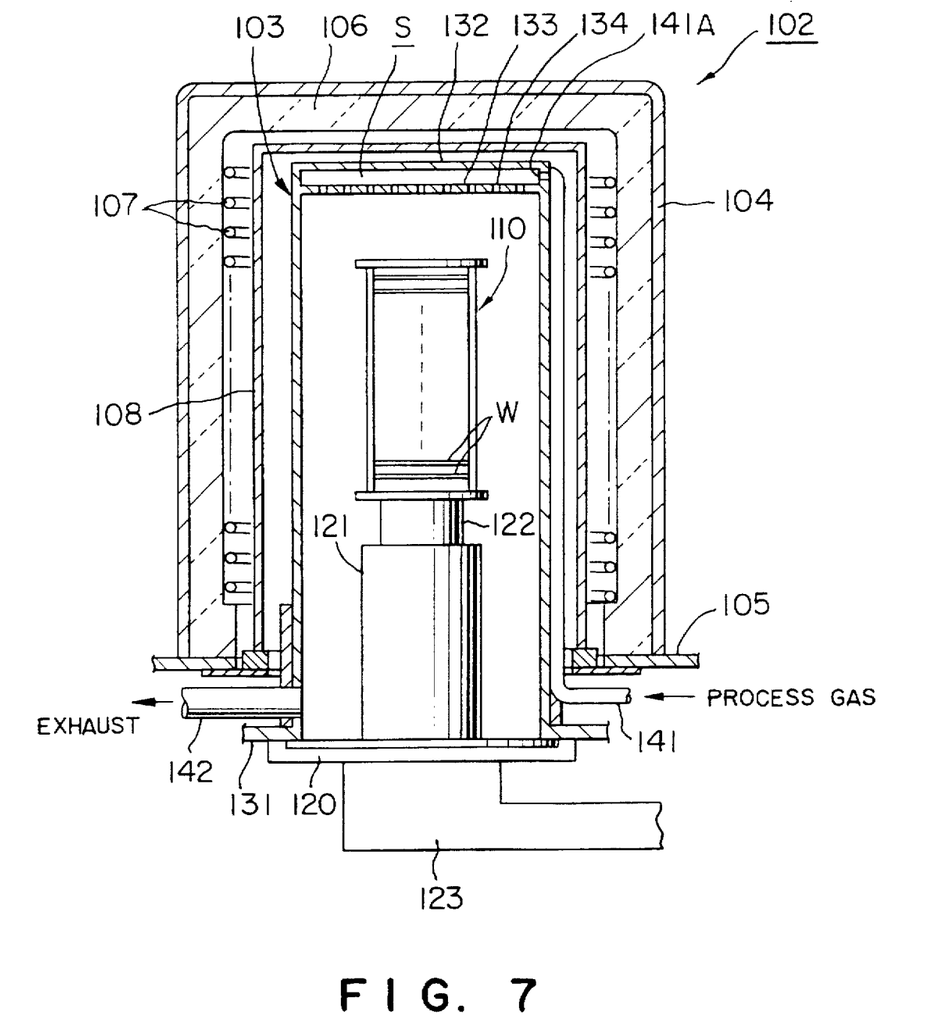
FIG. 7 is a vertical sectional view of the heat treatment apparatus as illustrated in FIG. 6.

The heat treatment apparatus according to the second embodiment of the present invention will be explained with reference to the drawings attached hereto. FIG. 6 is a diagrammatic view of a heat treatment apparatus 101 according to the second embodiment of the present invention. FIG. 7 is a vertical sectional view of the heat treatment apparatus 101. A set number, for example 25 sheets, of silicon semiconductor wafers (hereinafter called "wafer"), objects to be treated, having a large diameter of above 250 mm, e.g., 300 mm are mounted, spaced one above another, on a ladder boat 110 as mounting jig disposed below the heat treatment apparatus 101 and are loaded into a reaction vessel 103 in a vertical furnace of the heat treatment apparatus on the lifted ladder boat 110 to be subjected to a required heat treatment, e.g., formation of, e.g., a silicon oxide film.

Figure 8:
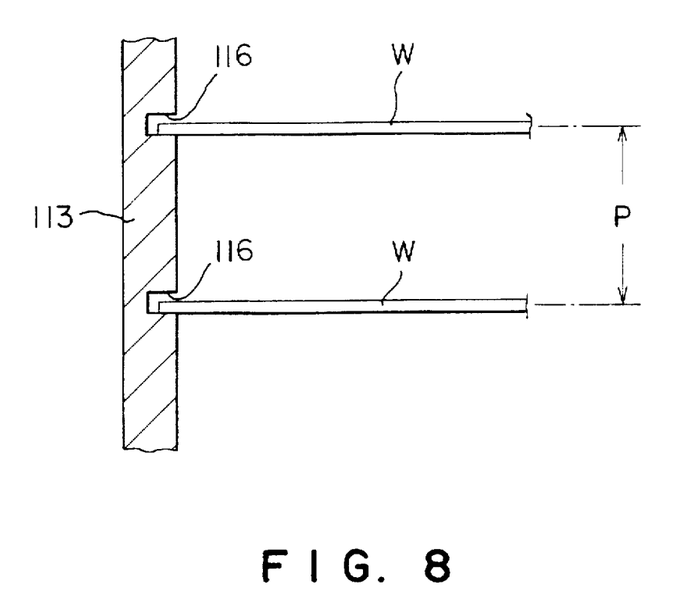
FIG. 8 is an enlarged vertical sectional view of the wafer support portion of the ladder boat of the heat treatment apparatus as shown in FIG. 6.

As shown in FIG. 6, the ladder boat 10 comprises a disc-shaped top plate 111 and a disc-shaped bottom plate 112, and three support rods 113, 114, 115 provided between the top plate 111 and the bottom plate 112, whereby a mounting portion is defined. Wafers carried in by carrying means 124, e.g., a carrier arm or others are placed in grooves 116 formed in the insides of the support rods 113, 114, 115 to be mounted on the ladder boat 110 in a horizontal direction A plurality of the grooves are formed in each support rod 113, 114, 115 in the direction of length. As shown in FIG. 8, a pitch of the grooves is so set that a pitch of the mounted wafers W is within a range of 10–160 mm, e.g., 40 mm.

As shown in FIG. 6, the ladder boat 110 having such structure is removably mounted at a support member 122 thereof on a quartz heat insulation cylinder 121 with a flange 120 of, e.g., stainless steel. The heat insulation cylinder 121 is mounted on a boat elevator 123 which is movable up and down. The boat elevator 123 is lifted to load the wafers W on the ladder boat 110 at a set position in a reaction tube 103 in a vertical furnace 102.

Next, with reference to FIG. 7, the general structure of the vertical furnace 102 which forms a required silicon oxide film on the wafers W will be explained. A casing 104 of the vertical furnace 102 has the lower end secured to the top surface of a base plate 105. The casing 104 has a substantially cylindrical shape the top surface of which is flat and has the inside surface covered with a heat insulating material 106. On the inside circumferential surface of the casing 104 there is provided a heater 107 in, e.g., a helix (coil) which is formed of a resistance heater, as of molybdenum disilicide.

A liner tube 108 of, e.g., SiC is provided between the heater 107 and the reaction vessel 103, surrounding the reaction vessel 103. The heater 107, by suitable temperature control means (not shown), heats the interior of the reaction vessel 103 uniformly up to an arbitrary temperature, e.g., 600°–1000° C. in a 300°–1100° C. temperature range and maintains the arbitrary temperature.

The reaction vessel 103, which has a processing region therein, has, as described above, a substantially tubular shape having the flat top surface and is vertically erected by means of the flange on the lower end thereof on a base plate (not shown) which is other than the base plate 105. A gas discharge plate 133 is provided upper inside the reaction vessel 103 in parallelism with a ceiling 132 of the reaction vessel 103. A number of gas discharge holes 134 are formed in the gas discharge plate 133.

A space S defined by the gas discharge plate 133, the top plate 132, etc. forms the so-called processing gas preparatory chamber. A processing gas supplied into the space S is discharged uniformly through the gas discharge holes 134 onto the wafers loaded in the reaction vessel 103.

A processing gas for forming silicon oxide film, e.g., $O_2$ (oxygen gas) is led through a processing gas feed pipe 141 provided along an outside of the reaction vessel 103 to be introduced into the space S defined upper inside the reaction vessel 103 through processing gas discharge holes 141A, and then discharged into the reaction vessel 103 through the processing gas discharge holes 134. The processing gas which has reacted for processing is discharged outside through a discharge pipe 142 provided in a lower part of the reaction vessel 103.

Then, the operation, etc. of the heat treatment apparatus 1 according to the second embodiment will be explained. First the heater 107 is heated to raise an internal temperature of the reaction vessel 103 up to, e.g., about 600° C. while $N_2$ gas is introduced into the reaction vessel 103 through the processing gas feed pipe 141 to place the interior of the reaction vessel 103 in an $N_2$ gas atmosphere. Then, wafers W, objects to be treated, are mounted on the ladder boat 110, then the boat elevator 132 is lifted to raise the ladder boat to a position where, as shown in FIG. 7, the flange 120 of the heat insulation cylinder 121 is brought into close contact with the flange 131 of the lower part of the reaction vessel 103 to thereby load the wafers W in the reaction vessel 103, and air-tightly close the reaction vessel 103.

Then, the interior of the reaction vessel 103 is heated to a required processing temperature, e.g., 1000° C., and $O_2$ (oxygen) gas is supplied into the reaction vessel 103 through the processing gas feed pipe 141 while the interior of the reaction vessel 103 is exhausted through the discharge pipe 142 to maintain the interior of the reaction vessel 103 under the atmospheric pressure. In this condition the heat treatment is conducted for a required period of time. A silicon oxide film ($SiO_2$) film of a required thickness is formed on the surfaces of the wafers W.

The above-described temperature increase from the preheating temperature 600° C. to the processing temperature 1000° C. must be conducted at high rates so as to improve throughputs, take advantage of the batch processing, and lower thermal budget in terms of processing. The wafers W, which are objects to be treated by the heat treatment apparatus according to the second embodiment, are 300 mm-diameter wafers, which are considerably larger than the conventional 200 mm-diameter wafers. The wafers W mounted at the conventional mounting pitch will have large differences in heat radiation amount from the heater 107 between the peripheral parts thereof and the central parts thereof. As a result, the wafers W have large intra-surface temperature differences, which cause slips in the wafers W.

The ladder boat 110 used in the second embodiment has a 40 mm pitch as described above, which decreases intra-surface temperature differences in the wafers to thereby preclude occurrences of slips.

The inventors of the present invention had simulations to prove the advantage. The internal temperature increase of the reaction vessel 103 from 600° C. to 1000° C. was raised at a high rate of 100° C./min, and the intra-surface temperature difference of the wafers W could be suppressed to 10° C. This intra-surface temperature difference will generate no slip. For comparison this result with the conventional heat treatment apparatus, wafers are mounted at a 10 mm mounting pitch, and the internal temperature of the reaction vessel 103 was raised at the same rate. The intra-surface temperature difference of the wafers was even 130° C. when the temperature passed 900° C. Thus, it was confirmed that the heat treatment apparatus according to the second embodiment can suppress intra-surface temperature differences smaller than the conventional heat treatment apparatus which uses the high-rate temperature increasing process in a heat treatment. In a case that the oxidation takes a longer period of time, throughput differences are larger, and the second embodiment has much higher productivity than the sheet heat treatment apparatus. Accordingly large-diameter wafers of a 300 mm diameter can be heat treated with higher productivity than the sheet heat treatment apparatus and even without occurrence of slips.

The second embodiment is applied to an atmospheric pressure-heat treatment apparatus for oxidation and diffusion, but is also applicable to low-pressure heat treatment apparatuses, e.g., low-pressure CVD apparatuses.

The heat treatment apparatus according to the second embodiment, in a case that large-diameter wafers of an above 250 mm diameter are heat treated, can use the batch processing, using a mounting jig for mounting a plurality of wafers without occurrence of slips. No slip occurs in the wafers even with a process of a temperature increase of 20° C./min. Good throughputs can be accordingly obtained, and higher productivity can be attained than sheet heat treatment apparatuses.

What is claimed is:

1. A process for heat treating a plurality of semiconductor wafers in a substantially tubular reaction vessel located in a tubular furnace, each of said semiconductor wafers having a diameter of about 300 mm, said process comprising the steps of:

mounting said semiconductor wafers in parallel one above another in a mounting jig at a vertical mounting pitch of 18–20 mm;

loading said mounting jig having said semiconductor wafers mounted therein into said reaction vessel;

heating said semiconductor wafers to a temperature above 600° C. and below 950° C. at a rate in which the temperature increases by up to 10° C./minute, a temperature above 950° C. and below 1000° C. at a rate in which the temperature increases by up to 40° C./minute, a temperature above 1000° C. and below 1025° C. in which the temperature increases by up to 3° C./minute, and a temperature above 1025° C. and below 1050° C. at a rate in which the temperature increases by up to 2° C./minute, and cooling said semiconductor wafers from a temperature of 1050° C. to 600° C. at a rate in which the temperature decreases by up to 3° C./minute.

2. The process defined by claim 1, wherein:

said mounting jig is a ladder boat having a vertical mounting pitch of about 18 mm.

3. The process defined by claim 1, wherein:

said mounting jig is a ring boat having a vertical mounting pitch of about 20 mm.

* * * * *